US006689684B1

(12) United States Patent
You et al.

(10) Patent No.: US 6,689,684 B1
(45) Date of Patent: Feb. 10, 2004

(54) CU DAMASCENE INTERCONNECTIONS USING BARRIER/CAPPING LAYER

(75) Inventors: Lu You, San Jose, CA (US); Fei Wang, San Jose, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 230 days.

(21) Appl. No.: 09/783,619

(22) Filed: Feb. 15, 2001

(51) Int. Cl.[7] .......................................... H01L 21/4763
(52) U.S. Cl. ........................ 438/639; 438/627; 438/648
(58) Field of Search ................................ 438/625, 637, 438/639, 643, 648, 627, 629, 638, 647, 657

(56) References Cited

U.S. PATENT DOCUMENTS 5,990,011 A * 11/1999 McTeer
6,025,264 A * 2/2000 Yew et al.
6,300,236 B1 * 10/2001 Harper et al.
6,303,486 B1 * 10/2001 Park
6,498,091 B1 * 12/2002 Chen et al. .................. 438/627

* cited by examiner

Primary Examiner—Phuc T. Dang

(57) ABSTRACT

Interconnects to an underlying Cu feature are formed with improved reliability by replacing a portion of the capping layer in the bottom of an opening in an overlying dielectric layer, e.g., an ILD, with a barrier material, such as Ta or TaN. During Ar sputter etching to round the ILD corners, the exposed barrier layer portion is removed and redeposited to form a liner on the side surfaces of the dielectric layer defining the opening, thereby avoiding Cu redeposition on, and/or penetration through, the side surfaces of the dielectric layer.

12 Claims, 8 Drawing Sheets

CU DAMASCENE INTERCONNECTIONS USING BARRIER/CAPPING LAYER

FIELD OF THE INVENTION

The present invention relates to a method of manufacturing semiconductor devices having dimensions in the deep sub-micron regime with greater reliability. The present invention has particular applicability in manufacturing high density, multi-level semiconductor devices comprising copper and/or copper dual damascene interconnection structures and exhibiting high circuit speed.

BACKGROUND ART

Interconnection technology is constantly challenged to satisfy the ever-increasing requirements for high density and performance associated with ultra large scale integration semiconductor devices. As the feature sizes continue to shrink it becomes increasingly difficult to form interconnection patterns exhibiting the requisite circuit speed with high dimensional accuracy and reliability.

The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.18 micron. The rejection rate due to integrated circuits speed delays in sub-micron regimes has become a limiting factor in fabrication.

The dielectric constant of materials currently employed in the manufacture of semiconductor devices for an interlayer dielectric (ILD) ranges from about 3.9 for dense silicon dioxide to over 8.0 for deposited silicon nitride. The value of the dielectric constant expressed herein is based upon a value of one for a vacuum. In an effort to reduce interconnect capacitance, dielectric materials with lower values of permitivity have been explored. The expression "low-k" material has evolved to characterize materials with a dielectric constant less than about 3.9, based upon a value of the dielectric constant of a vacuum as one (1). One type of low-k material that has been explored are a group of spin on or CVD siloxane materials, such as hydrogen silsesquioxane (HSQ) and methyl silsesquioxane (MSQ) and Black-Diamond™ dielectric available from Applied Materials, Santa Clara, Calif.,. There are several organic low-k materials, typically having a dielectric constant of about 2.0 to about 3.8, which offer promise for use as an ILD, such as FLARE 20™ dielectric, a poly(arylene) ether, available from Allied Signal, Advanced Micromechanic Materials, Sunnyvale, Calif. BCB (divinylsiloxane bis-benzocyclobutene) and Silk™ dielectric, an organic polymer similar to BCB, both available from Dow Chemical Co., Midland, Mich.

In implementing Cu and/or Cu alloy damascene techniques to form interconnection patterns with dimensions in the deep sub-micron regime, particularly when employing various low-k materials, including porous oxides, such as dielectric oxides having a porosity of about 30% to about 80% and a dielectric constant (k) of about 2.0 or lower, various problems evolve which degrade the resulting semiconductor device. For example, copper readily diffuses into conventional silicon-based materials such as polysilicon, single-crystalline, silicon dioxide, low-k inorganic and organic materials. Once semiconductive silicon-based materials are Cu doped, transistors made within or in close proximity to the Cu doped silicon-based regions either cease to function properly or are significantly degraded in electrical performance.

Accordingly, there exists a need for methodology enabling the manufacture of interconnection patterns having feature sizes in the deep sub-micron regime with greater dimensional accuracy, increased circuit speed, and improved reliability. There exists a particular need for methodology enabling the formation of semiconductor devices comprising Cu and/or Cu alloy interconnection patterns with improved reliability and increased circuit speed.

DISCLOSURE OF THE INVENTION

An advantage of the present invention is a method of manufacturing a semiconductor device exhibiting improved reliability and increased circuit speed.

Another advantage of the present invention is a semiconductor device comprising a Cu or a Cu alloy interconnection pattern exhibiting high circuit speed and improved reliability.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a copper (Cu) or Cu alloy feature in a first dielectric layer; forming a composite layer on an upper surface of the Cu or Cu alloy feature and on an upper surface of the first dielectric layer, the composite layer comprising: (a) a first capping layer portion, comprising a first material, formed at least on the upper surface of the first dielectric layer; and (b) a second barrier layer portion having first and second side surfaces adjoining the first capping layer portion, the second barrier layer portion comprising a second material different from the first material and on at least part of the upper surface of the Cu or Cu alloy feature; forming a second dielectric layer on the composite layer overlying the first dielectric layer; etching to form an opening defined by side surfaces and upper corners of the second dielectric layer and to expose an upper surface of the second barrier layer portion; and sputter etching to round the upper corners, to remove at least part of the exposed second barrier layer portion and to redeposit the removed part of the second barrier layer portion on the side surfaces of the second dielectric layer to form a first barrier layer sidewall thereon.

Another aspect of the present invention is a semiconductor device comprising: a lower copper (Cu) or Cu alloy feature in a first dielectric layer; a lower capping layer on at least an upper surface of the first dielectric layer; a second dielectric layer on the lower capping layer overlying the first dielectric layer; an opening defined by side surfaces of the second dielectric layer; a first barrier layer on the side surfaces of the second dielectric layer; and a second barrier layer sidewall on the first barrier layer sidewall with an interface therebetween.

Embodiments of the present invention include forming the capping layer from silicon nitride, silicon oxynitride or silicon carbide, and forming the barrier layer portion of the composite layer of Ta or TaN. Embodiments of the present invention further include forming the first barrier layer sidewall at a thickness of about 50 Å to about 11 Å. In accordance with embodiments of the present invention, the composite barrier/capping layer can be formed by depositing the capping layer, forming a photoresist mask thereon, and etching to remove all or a portion of the capping layer to form an opening or a recess, respectively, therein. The opening or recess is then filled with the barrier layer material and CMP conducted to planarize the upper surface. Embodiments of the present invention further include sputter etching to remove all or a portion of the exposed barrier layer to form the barrier layer sidewall.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

DESCRIPTION OF THE INVENTION

Figure 1:
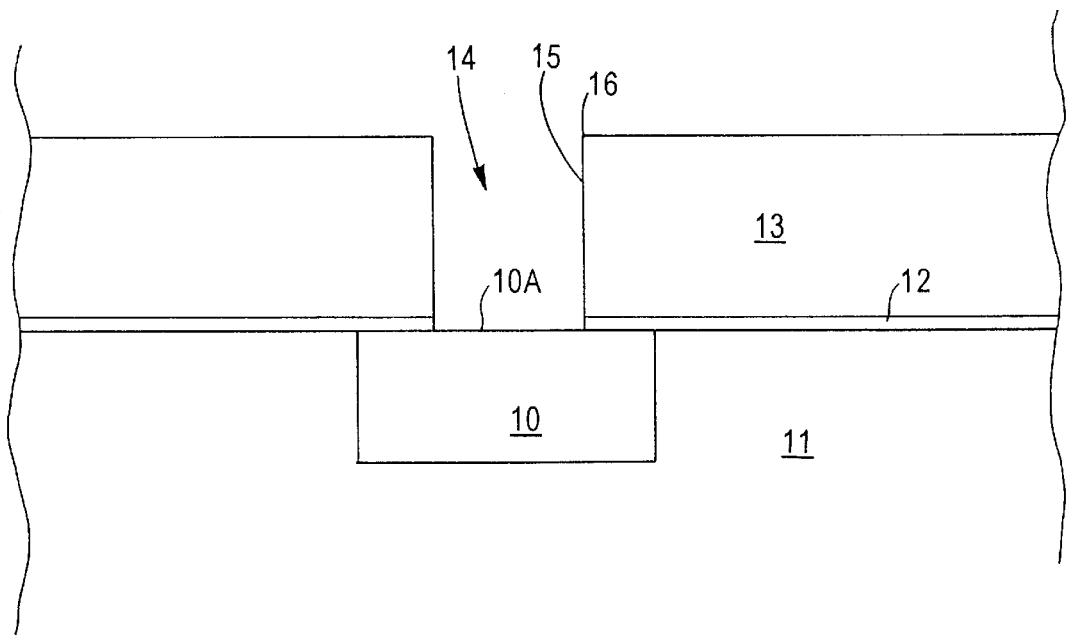
FIGS. 1 and 2 illustrate a prior art technique resulting in copper redeposition on side surfaces defining an opening in the dielectric layer.

The present invention addresses and solves problems impacting device reliability as feature sizes plunge into the deep sub-micron regime in an effort to satisfy the ever increasing demands for miniaturization and high circuit speed. In attempting to fabricate Cu and/or Cu alloy interconnection patterns, particularly employing damascene techniques and low-k dielectric material, various problems arise which adversely impact device reliability. For example, adverting to FIGS. 1 and 2, wherein similar features or elements are denoted by similar reference numerals, conventional practices comprise forming a Cu or Cu alloy feature 10 in an underlying dielectric layer 11. As used throughout this disclosure, the symbol "Cu" is intended to include substantially pure elemental copper, copper containing unavoidable impurities and copper alloys containing minor amounts of elements such as tantalum, indium, tin, zinc, manganese, chromium, titanium, germanium, strontium, platinum, magnesium, aluminum or zirconium.

With continued reference to FIG. 1, a capping layer 12, such as silicon nitride, is formed on an upper surface of the Cu feature 10 and underlying dielectric layer 11. An overlying dielectric layer 13 is then formed on capping layer 12, a photoresist mask (not shown) is formed thereon, and anisotropic etching is conducted to form an opening 14 defined by side surfaces 15 of dielectric layer 13. It should be understood that opening 14 may comprise a trench in which a metal line is formed or a dual damascene opening comprising a trench with an underlying via hole, which dual damascene opening is subsequently filled, as with Cu, to form a Cu line communicating with an underlying via or contact. In implementing conventional Cu metallization, a barrier layer is initially deposited to line the opening, a seedlayer deposited thereon and Cu deposited by electrodeposition or electroless deposition. As shown in FIG. 1, anisotropic etching is conducted to form opening 14 exposing an upper surface 10A of underlying Cu feature 10. Reference numeral 16 denotes the corners of the trench opening 14.

Figure 2:
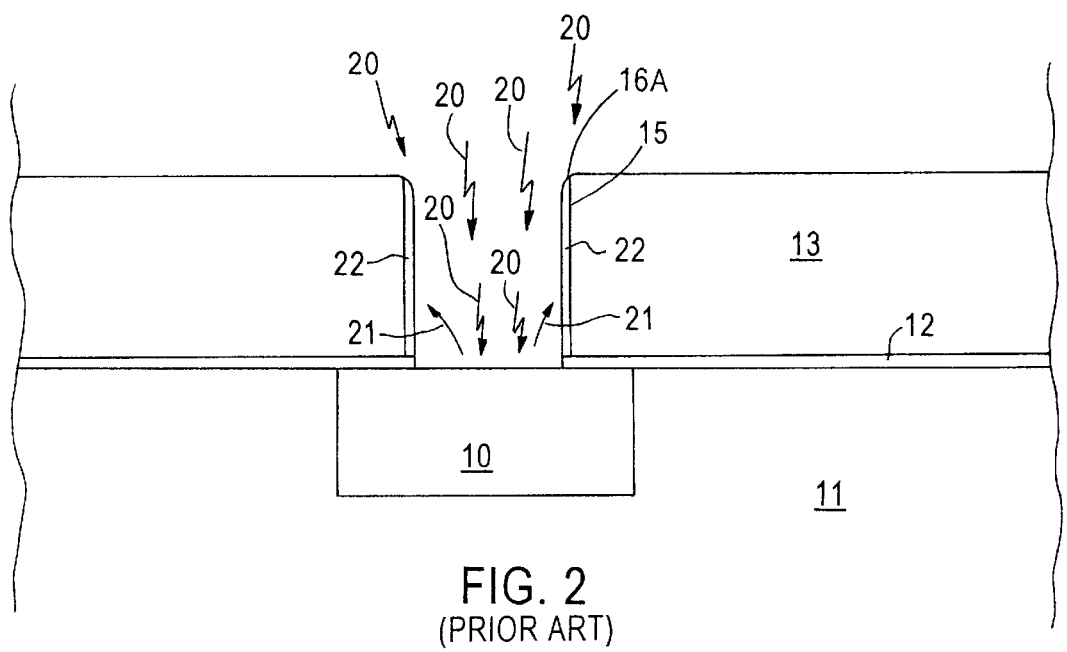
Figure 3:
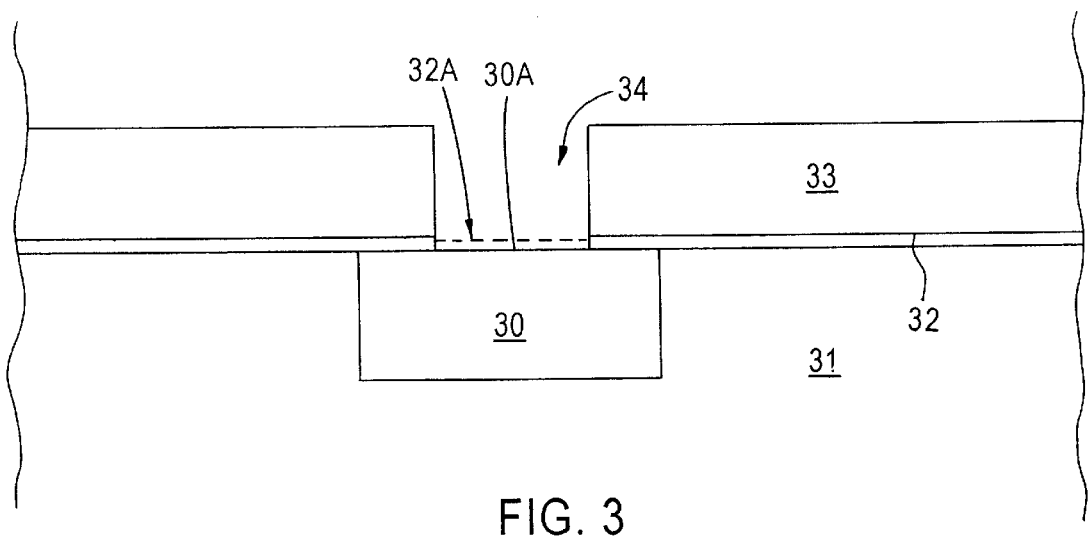
FIGS. 3 through 7 illustrate sequential phases of a method in accordance with an embodiment of the present invention.

Adverting to FIG. 2, conventional argon (Ar) sputter etching is then conducted illustrated by zig zag arrows 20, to round corner 16 thereby forming rounded corners 16A and to facilitate subsequent lining of the opening 14 with a barrier layer material prior to Cu deposition. Ar sputter etching also removes oxides which may have formed on the upper surface 10A of Cu feature 10 to facilitate electrical connection thereto.

In implementing the prior art technique illustrated in FIGS. 1 and 2, it was found that during Ar sputter etching, Cu is removed from the upper surface of Cu feature 10, as illustrated by arrows 21, and redeposits as a layer 22 on the side surfaces 15 of dielectric layer 13. The resulting structure would contain Cu between the subsequently deposited barrier metal and dielectric layer 13. Such redeposited copper 22 would ultimately penetrate dielectric layer 13 and eventually poison one or more transistors of the device. This problem would appear particularly acute when employing low-k dielectric materials for dielectric layer 13, such as porous oxides or polymers having a porosity of about 30% to about 80% and a dielectric constant of about 2.0 or below.

The present invention addresses and solves such problems, as illustrated in FIGS. 1 and 2, by methodology which prevents the removal of Cu from the underlying Cu feature and, thereby, preventing redeposition of Cu on the side surface of the dielectric layer and, hence, preventing transistor poisoning. In accordance with embodiments of the present invention, rather than forming a capping layer overlying the Cu feature and underlying dielectric layer, a composite barrier/capping layer is formed. The composite barrier/capping layer comprises a barrier layer portion formed on the exposed upper surface of the underlying Cu feature. In this way, during sputter etching part or all of the barrier layer is removed and redeposited as a barrier sidewall on the side surfaces of the dielectric layer that define the opening, thereby preventing Cu contamination. Embodiments of the present invention include forming a first barrier sidewall having a thickness of about 50 Å to about 100 Å on the side surfaces of the dielectric layer. Suitable materials for the barrier layer portion of the composite barrier/capping layer include Ta and TaN, although any conventional barrier layer material, such as WN, can be employed. After Ar sputter etching, a barrier layer is deposited and formed as a liner on the first barrier sidewall. Accordingly, an interface exits between the barrier liner deposited after Ar sputter etching and the barrier sidewall redeposited on side surfaces of the dielectric layer. Embodiments of the present invention further include depositing a barrier layer after Ar sputter etching which is different from the redeposited barrier sidewall.

Embodiments of the present invention, therefore, enable the fabrication of semiconductor device having complex Cu interconnection patterns with feature sizes in the deep sub-micron regime with not only high circuit speed employing various low-k materials, but also with extremely high reliability. The present invention is particularly applicable to interconnect technology involving damascene techniques. Thus, embodiments of the present invention comprise depositing a layer comprising a low-k material, and forming an opening in the low-k dielectric layer by damascene techniques, including dual damascene techniques. The openings formed in the low-k dielectric layer can be a via hole which is subsequently filled with a metal, such as copper (Cu) or a Cu alloy, to form a via interconnecting upper and lower metal lines, or a contact hole in which case the Cu or Cu alloy filled contact hole electrically connects a first metal layer with a source/drain region in the semiconductor substrate. The opening in the low-k dielectric layer can also be a trench, in which case the filled trench forms an interconnection line. The opening can also be formed by a dual damascene technique, in which a via/contact communicating with a line is simultaneously formed by metal deposition.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

A method in accordance with an embodiment of the present invention is schematically illustrated in FIGS. 3 through 7 wherein similar features or elements are denoted by similar reference numerals. Adverting to FIG. 3, a Cu feature 30 is formed in an underlying dielectric layer 31 and a capping layer 32, such as silicon nitride having a suitable thickness, such as about 400 Å to about 600 Å, e.g., about 500 Å, is formed to cover the upper surface of Cu feature 30 and the upper surface of underlying dielectric layer 31. A photoresist mask 33 is then formed on capping layer 32. Photoresist mask 33 has an opening 34 exposing at least a portion of capping layer 32 on metal feature 30. It should be understood that opening 34 can be fully landed in that the bottom of opening 34 is completely over Cu feature 30, or partially thereon. Anisotropic etching is then conducted, using photoresist mask 33, to remove either all of the exposed capping layer 32 forming an opening exposing an upper surface 30A of Cu feature 30. Alternatively, anisotropic etching can be conducted to remove a portion of exposed capping layer 32 to reduce its thickness forming a recess leaving a portion 32A thereof as shown in phantom.

Figure 4:
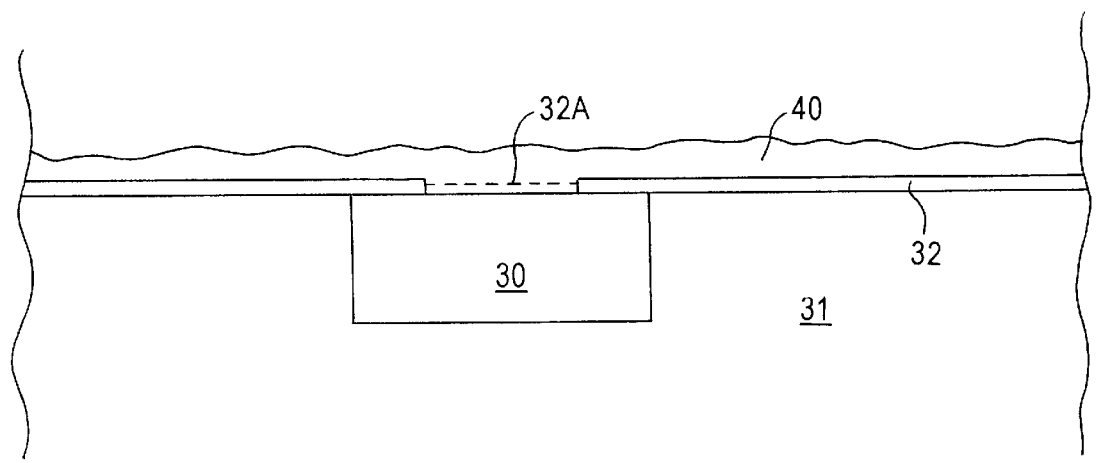

As shown in FIG. 4, a layer of barrier material 40, such as Ta or TaN, is then deposited filling the recess or opening formed in capping layer 32 (FIG. 1) and forming an overburden. As shown in FIG. 4, phantom line 32A illustrates the embodiment where a recess is formed in capping layer 32 such that only a portion of the capping layer is removed by anisotropic etching (FIG. 1).

Figure 5:
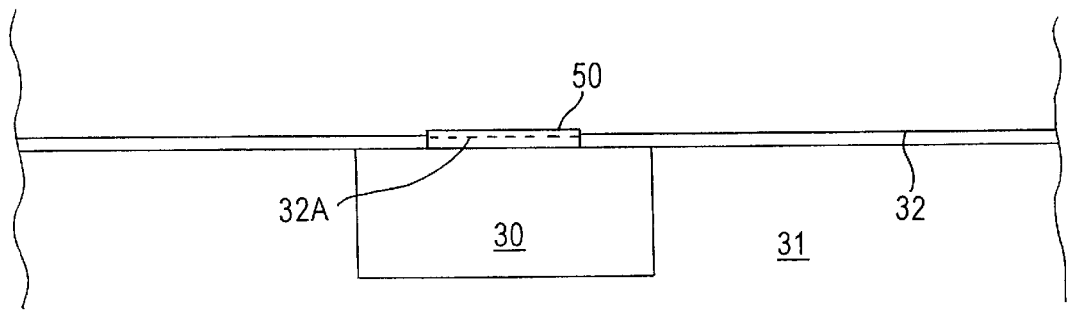

CMP or etch back is then conducted, as shown in FIG. 5, such that the upper surface of the composite layer comprising the barrier metal portion 50 and capping layer portion 32 is substantially coplanar. In the embodiment wherein a recess is formed in capping layer 32 and filled with barrier layer material 40, the thickness of the barrier layer component 50 shown in FIG. 5 overlying portion 32A of barrier layer 32 is typically about 100 Å to about 200 Å, while the thickness of the barrier layer 32 is about 400 Å to about 600 Å, e.g., about 500 Å.

Figure 6:
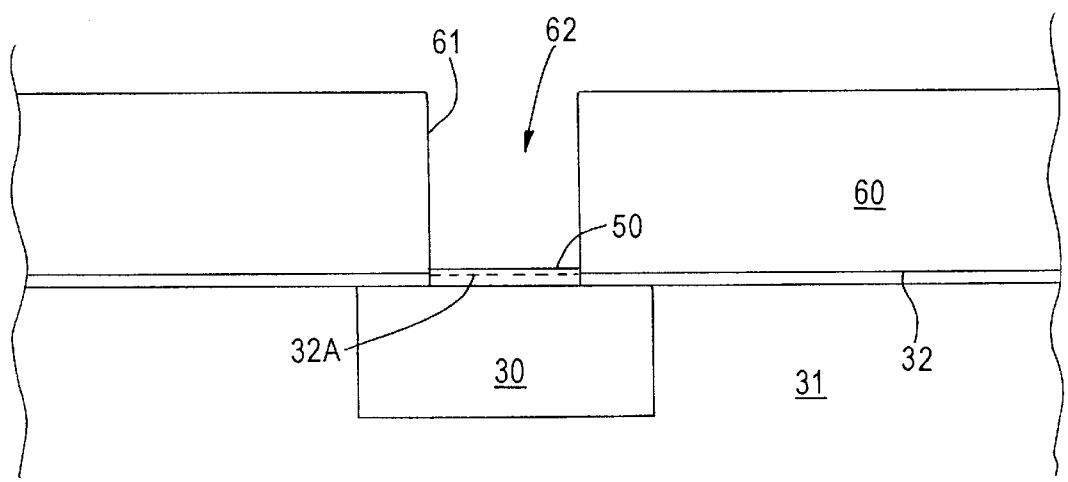
Figure 7:
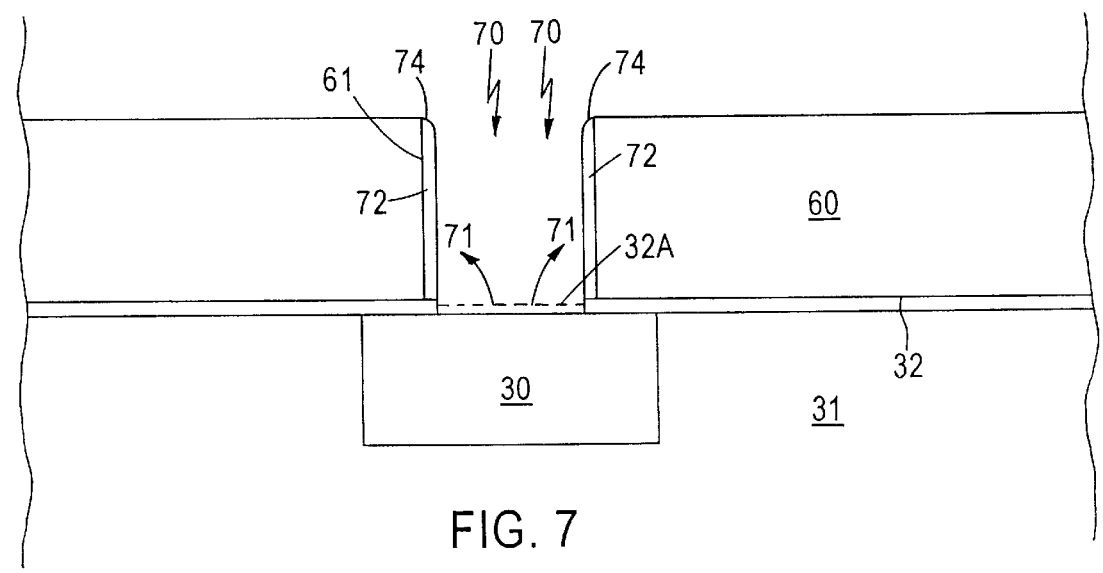

Adverting to FIG. 6, a dielectric layer 60 is formed on the composite barrier/capping layer 50/32 with an opening 62 therein defined by side surfaces 61 of dielectric layer 60. Ar sputter etching is then conducted, as shown by zig zag arrows 70 in FIG. 7, to round the upper corners 74 of the side surfaces 61 of dielectric layer 60. During such Ar sputter etching, all or a portion of the barrier layer material 50 is removed, as shown by arrows 71, and redeposited to form a first barrier sidewall or liner 72 on the side surfaces 61 of dielectric layer 60. First barrier liner 72 typically has a thickness of about 50 Å to about 100 Å. Subsequent processing is conducted in accordance with conventional methodology and typically comprises depositing a barrier layer to line the opening, depositing a seedlayer, and electrodepositing or electroless depositing Cu to fill the opening thereby forming a Cu feature. Typical seedlayers include copper alloys containing magnesium, aluminum, zinc, zirconium, tin, nickel, palladium, silver or gold in a suitable amount, e.g., about 0.3 to about 12 at. %.

A method in accordance with another embodiment of the present invention illustrating a dual damascene technique is schematically illustrated in FIGS. 8 through 12, wherein similar features or elements are denoted by similar reference numerals. In FIGS. 8 through 11, sequences are shown illustrating a via first-trench last dual damascene technique. It should be understood, that the embodiments of the present invention can be implemented with trench first-via second dual damascene techniques.

Figure 8:
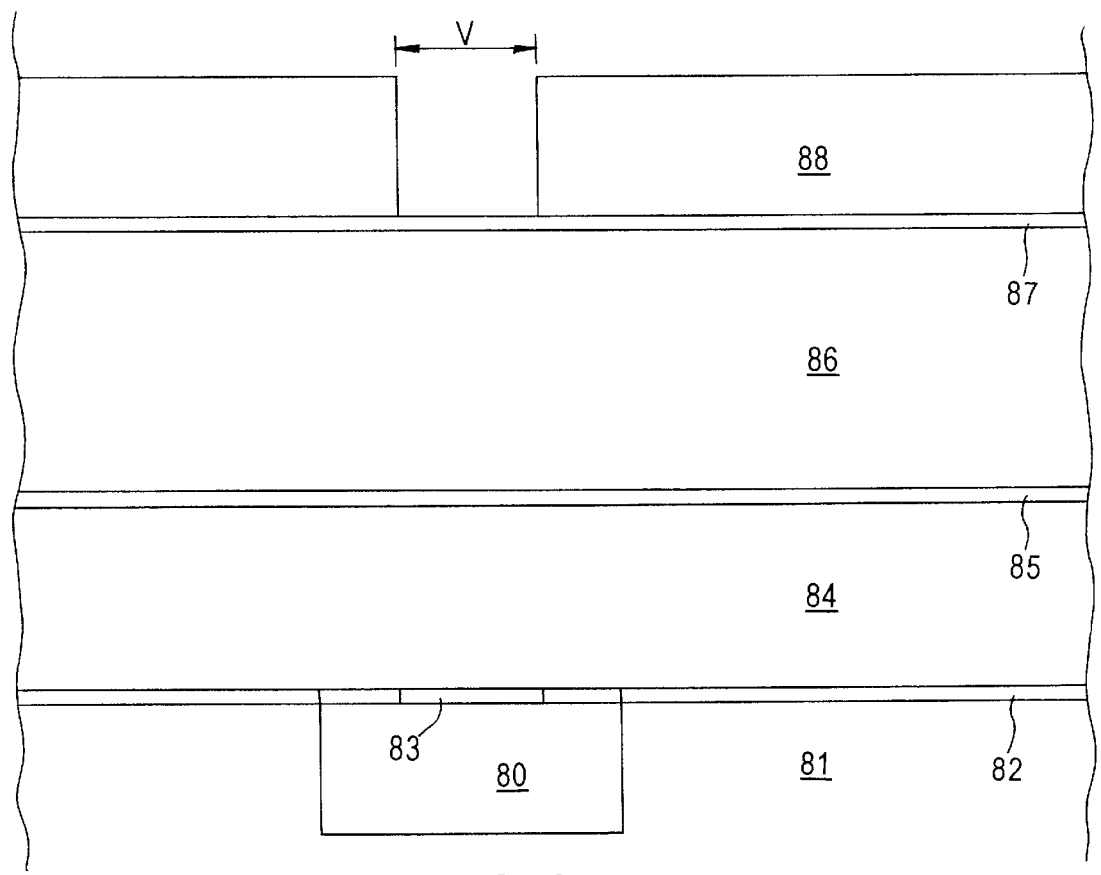
FIGS. 8 through 12 illustrate sequential phases of a method in accordance with another embodiment of the present invention.
Figure 9:
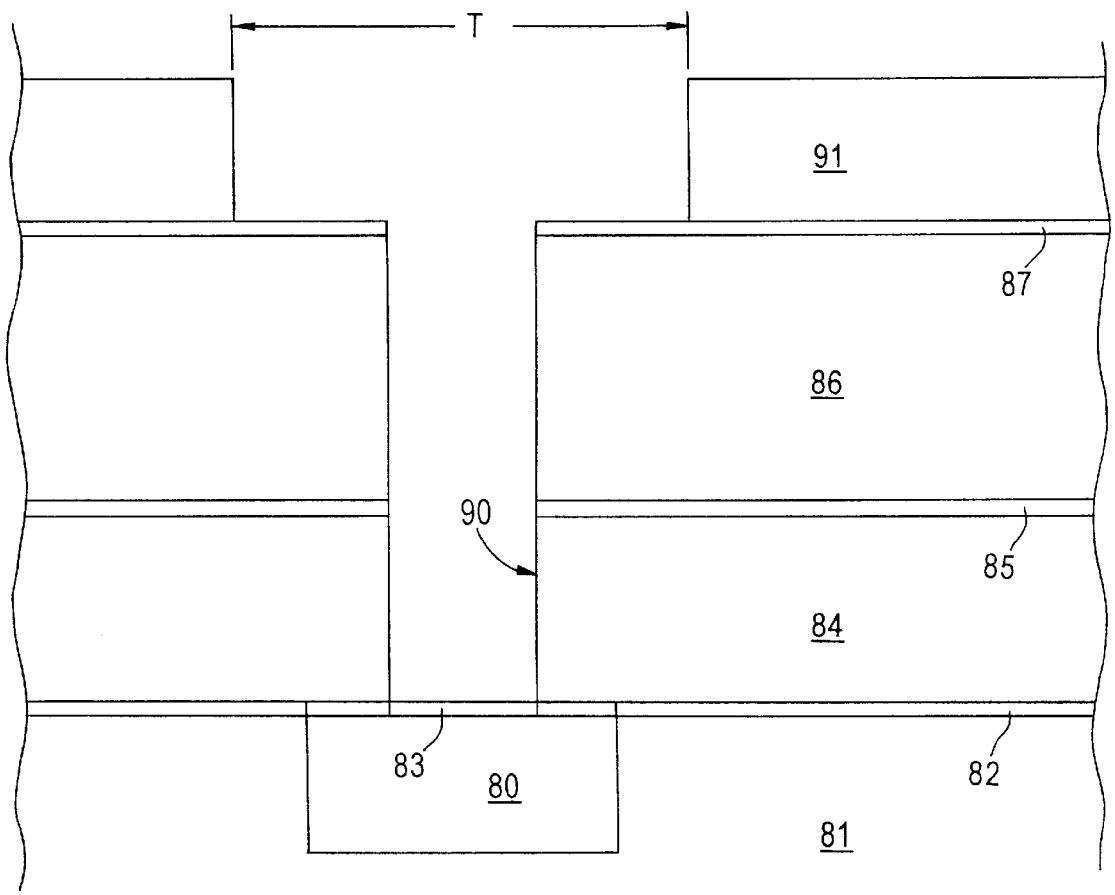
Figure 10:
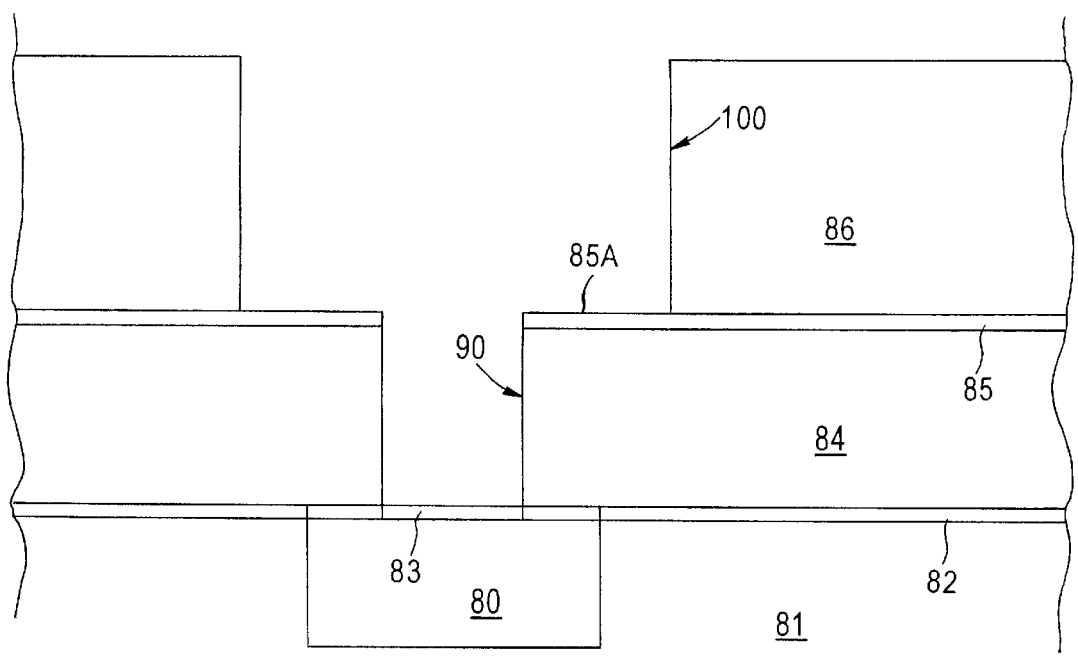

Adverting to FIG. 8, a Cu feature 80 is formed in dielectric layer 81, and a composite capping barrier/capping layer 83/82 is formed. Composite barrier/capping layer 83/82 is formed. Composite barrier/capping layer 83/82 comprises a capping layer material 82, such as silicon nitride, and a barrier layer material 83, such as Ta or TaN. A first overlying dielectric layer 84 is formed on composite barrier/capping layer 83/82, and a middle etch stop layer 85, such as silicon nitride, formed thereon. A first photoresist mask 88 is formed on capping layer 87 with an opening "V" defining the cross-sectional width of the via hole to be formed. Anisotropic etching is then conducted to form a via hole defined by side surfaces 90 in dielectric layer 84, illustrated in FIG. 9. Second photoresist mask 91 is then formed on capping layer 87 with an opening "T" defining the width of the trench to be formed in second overlying dielectric layer 86. Anisotropic etching is then conducted, stopping on middle etch stop layer 85, to form a trench defined by side surfaces 100 in second overlying dielectric layer 86, as shown in FIG. 10. Photoresist mask 91 is then removed and exposed portion 85A of capping layer 85 between the via and trench is also removed during or subsequent to photoresist removal.

Figure 11:
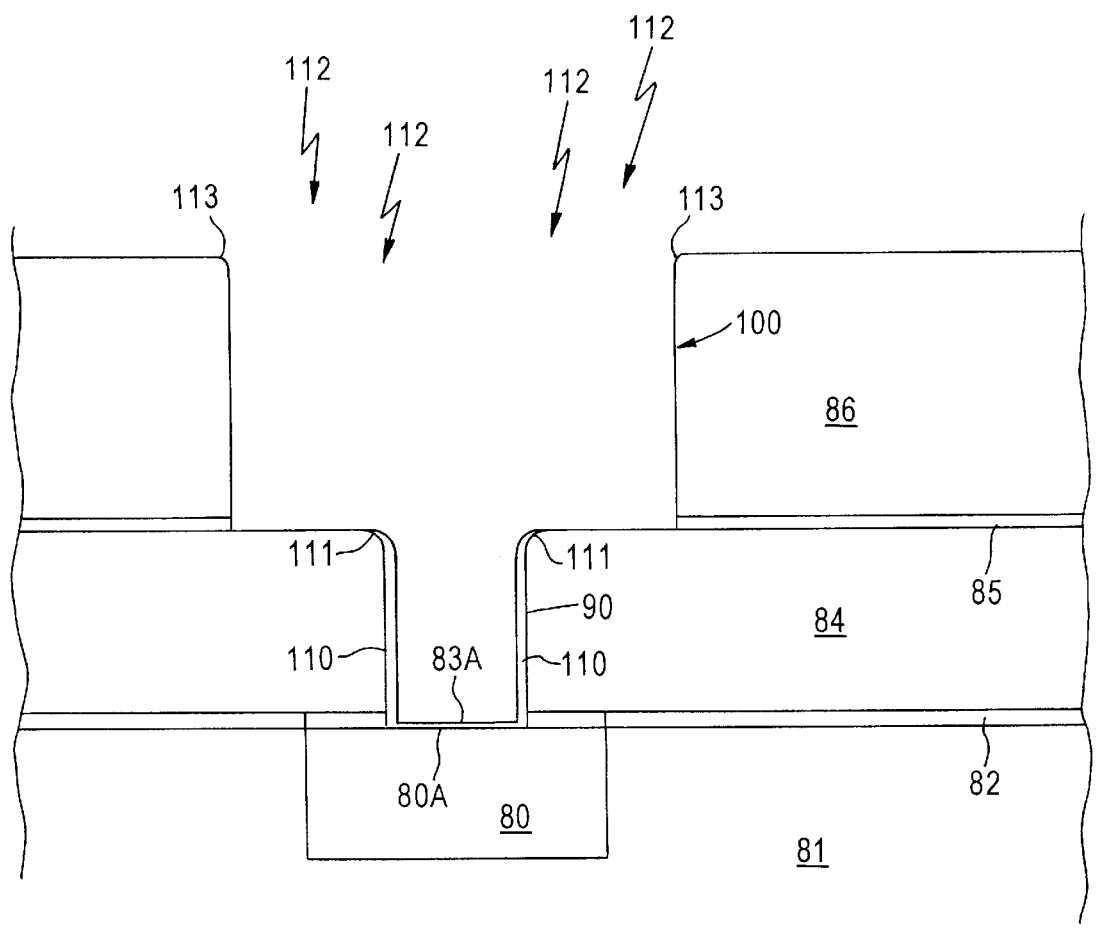
Figure 12:
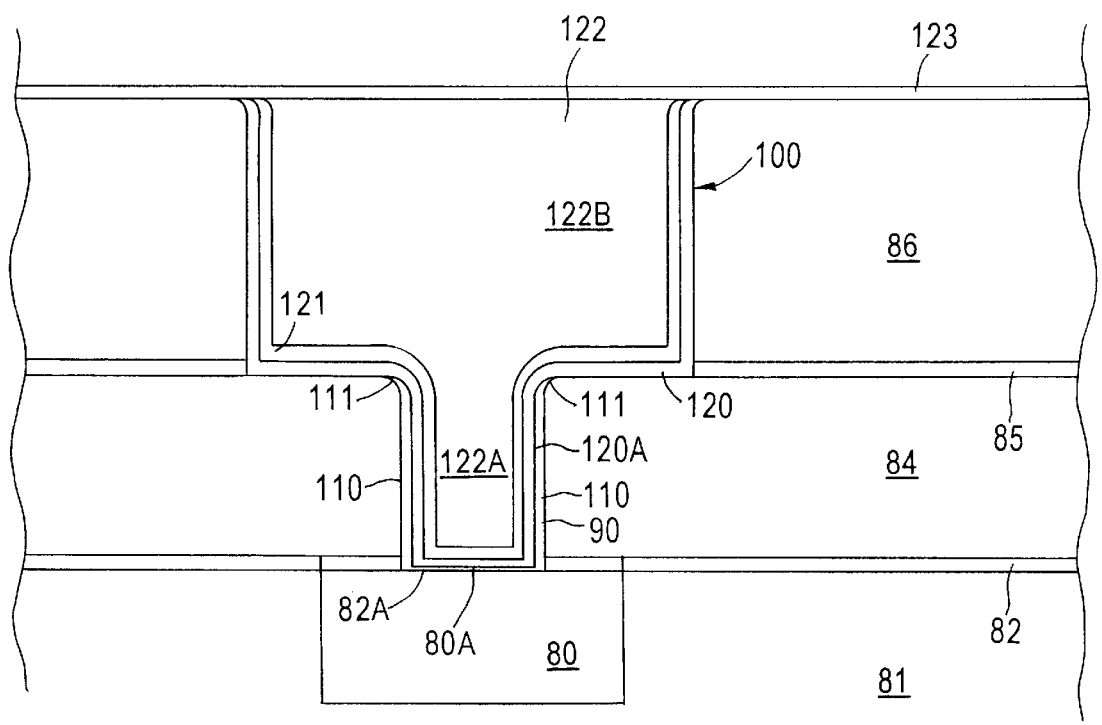

Adverting to FIG. 11, argon sputter etching is then conducted, as shown in FIG. 12, to round the corners 111 and 113 of the via hole and trench, respectively, to facilitate subsequent barrier metal layer deposition. During argon etching, at least a portion of the exposed barrier layer 83 is removed and redeposited as a first barrier metal liner 110 on the side surfaces of first overlying dielectric layer 84. Upon removing all of the exposed barrier material 83, the upper surface 80A of Cu feature 80 would be exposed. However, embodiments of the present invention also include removing a portion of the exposed barrier metal 83 thereby leaving a portion 83A.

Cu metallization is then implemented by depositing a barrier layer 120 lining the dual damascene opening, as illustrated in FIG. 12. A material for barrier layer 120 can be the same as or different from the material of forming the first barrier metal layer 110. In either case, an interface 120A is formed between first barrier layer 110 and second barrier layer 120 on side surfaces 90 of dielectric layer 84. Seedlayer 121 is then deposited followed by electrodeposition or electroless deposition of Cu to fill the dual damascene opening forming an overburden. CMP is then conducted so that the upper surface of the dual damascene structure 122 is substantially coplanar with the upper surface of the second overlying dielectric layer 86. A capping layer 123, such as silicon nitride or silicon oxynitride, is then formed thereon. The dual damascene structure 122 comprises Cu line 122B connected to Cu via 122A which, in turn, is in electrical contact with underlying Cu feature 80.

The present invention enjoys industrial applicability in manufacturing highly integrated semiconductor devices exhibiting increased circuit speed and sub-micron dimensions, e.g., with a design rule of about 0.18 micron and under, with high reliability. The present invention enjoys particular industrial applicability in manufacturing semiconductor devices with complex Cu damascene interconnection systems, employing both single and dual damascene techniques.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device comprising:
   a lower copper (Cu) or Cu alloy feature in a first dielectric layer;
   a lower capping layer on at least an upper surface of the first dielectric layer;
   a second dielectric layer on the lower capping layer overlying the first dielectric layer;
   an opening defined by side surfaces of the second dielectric layer;
   a first barrier layer on the side surfaces of the second dielectric layer; and
   a second barrier sidewall on the first barrier sidewall with an interface therebetween, wherein the second barrier sidewall extends over the upper surface of the lower Cu or Cu alloy feature.

2. The semiconductor device according to claim 1, wherein:
   the first barrier sidewall comprises a first material; and
   the second barrier sidewall comprises a second material different from the first material.

3. The semiconductor device according to claim 2, wherein:
   the first material comprises tantalum or tantalum nitride; and
   the second material comprises tungsten nitride, titanium or titanium nitride.

4. The semiconductor device according to claim 1, wherein the first and second materials comprise tantalum or tantalum nitride.

5. The semiconductor device according to claim 1, wherein the capping layer has a thickness of about 400 Å to about 600 Å.

6. The semiconductor device according to claim 1, wherein the first barrier sidewall comprises a first material, the semiconductor device further comprising a layer of the first material on an upper surface of the lower Cu or Cu alloy feature.

7. The semiconductor device according to claim 1, wherein the first barrier sidewall has a thickness of about 50 Å to about 100 Å.

8. The semiconductor device according to claim 1, comprising a trench in communication with and overlying a via hole.

9. The semiconductor device according to claim 8, further comprising Cu or a Cu alloy filling the trench and via hole to form a dual damascene interconnection structure.

10. The semiconductor device according to claim 1, wherein the second barrier sidewall is directly on the upper surface of the lower Cu or Cu alloy feature.

11. The semiconductor device according to claim 6, wherein the second barrier sidewall if formed on the layer of the first material.

12. The semiconductor device according to claim 9, further comprising a seedlayer lining the opening and on the second barrier sidewall, with the Cu or Cu alloy on the seedlayer.

* * * * *